(12) United States Patent
Lee

(10) Patent No.: US 9,673,228 B2
(45) Date of Patent: Jun. 6, 2017

(54) DISPLAY PANEL

(71) Applicant: InnoLux Corporation, Maio-Li County (TW)

(72) Inventor: Kuan-Feng Lee, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 0 days.

(21) Appl. No.: 15/001,701

(22) Filed: Jan. 20, 2016

(65) Prior Publication Data
US 2016/0240559 A1     Aug. 18, 2016

(30) Foreign Application Priority Data
Feb. 17, 2015 (TW) .............................. 104105516 A

(51) Int. Cl.
| H01L 21/00 | (2006.01) |
| H01L 27/12 | (2006.01) |
| H01L 29/786 | (2006.01) |

(52) U.S. Cl.
CPC ........ *H01L 27/124* (2013.01); *H01L 27/1248* (2013.01); *H01L 29/7869* (2013.01)

(58) Field of Classification Search
CPC ............. H01L 27/124; H01L 29/78678; H01L 27/1248
See application file for complete search history.

(56) References Cited

U.S. PATENT DOCUMENTS

| 5,721,164 A * | 2/1998 | Wu ...................... H01L 27/1214 257/E21.414 |
| 6,265,249 B1 * | 7/2001 | Wu .................... H01L 29/78669 257/57 |
| 6,960,786 B2 * | 11/2005 | Yamazaki ........... H01L 27/3244 257/448 |
| 7,554,116 B2 * | 6/2009 | Yamazaki ........... H01L 27/3244 257/344 |
| 7,977,128 B2 * | 7/2011 | Cho ....................... C09K 13/00 257/E21.561 |
| 7,989,808 B2 * | 8/2011 | Yamazaki ........... H01L 27/3244 257/40 |
| 8,094,274 B2 * | 1/2012 | Tanaka .............. G02F 1/133707 349/129 |
| 8,168,980 B2 * | 5/2012 | Tsubata ................... H01L 27/12 257/401 |
| 8,207,537 B2 * | 6/2012 | Yamazaki ........... H01L 27/3244 257/59 |

(Continued)

*Primary Examiner* — Laura Menz
(74) *Attorney, Agent, or Firm* — McClure, Qualey & Rodack, LLP

(57) ABSTRACT

A display panel is provided, which includes a substrate and a first metal layer on the substrate. The first metal layer includes a gate electrode and a gate line connecting to the gate electrode. A first insulation layer is disposed on the first metal layer. A planarization layer is disposed on the first insulation layer. An opening, overlapping the gate electrode, is defined by sidewalls of the planarization layer and a surface of the first insulation layer. An active layer is disposed on the opening and the planarization layer. A second metal layer is disposed on the semiconductor layer, and includes a source electrode contacting the active layer and a data line connecting to the source electrode. The planarization layer and the first insulation layer are disposed between the data line and the gate line.

14 Claims, 24 Drawing Sheets

(56) References Cited

U.S. PATENT DOCUMENTS

| | | | | |
|---|---|---|---|---|
| 8,309,960 | B2* | 11/2012 | Toyota | H01L 27/1214 |
| | | | | 257/59 |
| 8,471,259 | B2* | 6/2013 | Yamazaki | H01L 27/3244 |
| | | | | 257/40 |
| 8,748,895 | B2* | 6/2014 | Yamazaki | H01L 27/3244 |
| | | | | 257/59 |
| 8,927,994 | B2* | 1/2015 | Yamazaki | H01L 27/3244 |
| | | | | 257/40 |
| 9,171,932 | B2* | 10/2015 | Cho | H01L 29/66742 |
| 2003/0230764 | A1* | 12/2003 | Yamazaki | H01L 27/3244 |
| | | | | 257/200 |
| 2005/0218452 | A1* | 10/2005 | Yamazaki | H01L 27/3244 |
| | | | | 257/347 |
| 2009/0315032 | A1* | 12/2009 | Yamazaki | H01L 27/3244 |
| | | | | 257/59 |
| 2011/0278578 | A1* | 11/2011 | Yamazaki | H01L 27/3244 |
| | | | | 257/59 |
| 2012/0261667 | A1* | 10/2012 | Yamazaki | H01L 27/3244 |
| | | | | 257/59 |
| 2013/0277709 | A1* | 10/2013 | Yamazaki | H01L 27/3244 |
| | | | | 257/99 |
| 2014/0191239 | A1* | 7/2014 | Yamazaki | H01L 27/3244 |
| | | | | 257/72 |
| 2016/0240559 | A1* | 8/2016 | Lee | H01L 27/124 |

* cited by examiner

DISPLAY PANEL

CROSS REFERENCE TO RELATED APPLICATIONS

This Application claims priority of Taiwan Patent Application No. 104105516, filed on Feb. 17, 2015, the entirety of which is incorporated by reference herein.

BACKGROUND

Technical Field

The disclosure relates to a thin film transistor, and in particular it relates to a thin film transistor substrate and a display apparatus.

Description of the Related Art

In the conventional process of manufacturing a thin film transistor substrate, an active layer is defined to correspond to a gate electrode and serve as a channel layer after forming the gate electrode and a gate line. Another metal layer is then formed, which includes a source electrode and a drain electrode on two sides of the active layer, and a data line connecting to the source electrode. Only a gate dielectric layer is disposed between the data line and the gate line at their overlapping location. The thickness of the gate dielectric layer should be reduced to reduce the driving current of the thin film transistor. However, the capacitance between the data line and the gate line will be larger with a thinner gate dielectric layer, thereby increasing the loading of the overlapping location of the data line and the gate line. In other words, the conventional structure cannot simultaneously reduce the driving current of the thin film transistor and reduce the capacitance between the data line and the gate line.

Accordingly, a novel thin film transistor substrate is called for to simultaneously reduce the driving current of the thin film transistor and reduce the capacitance between the data line and the gate line.

BRIEF SUMMARY

One embodiment of the disclosure provides a display panel, including a substrate, a first metal layer on the substrate, wherein the first metal layer includes a gate electrode and a gate line connecting to the gate electrode, and a first insulation layer on the first metal layer. The display panel also includes a planarization layer on the first insulation layer; an opening defined by sidewalls of the planarization layer and a surface of the first insulation layer, wherein the opening overlaps the gate electrode, an active layer on the planarization layer and covering the opening; and a second metal layer on the active layer, wherein the second metal layer includes a source electrode contacting the active layer and a data line connecting to the source electrode. The planarization layer and the first insulation layer are disposed between the data line and the gate line.

One embodiment of the disclosure provides a thin film transistor substrate, including a substrate, a first metal layer on the substrate, wherein the first metal layer includes a gate electrode and a gate line connecting to the gate electrode, and a first insulation layer on the first metal layer. The thin film transistor substrate also includes a planarization layer on the first insulation layer, an opening defined by sidewalls of the planarization layer and a surface of the first insulation layer, wherein the opening overlaps the gate electrode, an active layer on the planarization layer and covering the opening, and a second metal layer on the active layer, wherein the second metal layer includes a source electrode contacting the active layer and a data line connecting to the source electrode. The planarization layer and the first insulation layer are disposed between the data line and the gate line.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1A:
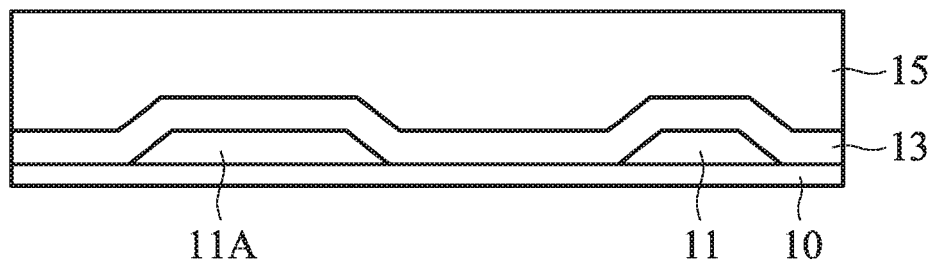
FIGS. 1A to 1D show cross sections of a thin film transistor substrate during different manufacturing stages in one embodiment of the disclosure.

The following description is of the best-contemplated mode of carrying out the disclosure. This description is made for the purpose of illustrating the general principles of the disclosure and should not be taken in a limiting sense. The scope of the disclosure is best determined by reference to the appended claims.

FIGS. 1A to 1D show cross sections of a thin film transistor substrate during different manufacturing stages in one embodiment of the disclosure. FIGS. 1A to 1D are cross sections along the dotted lines in the top views of FIGS. 2A to 2D, respectively. Note that the thin film transistor substrate can be completed by other methods and is not limited to the following steps. In addition, an additional step can be performed before, during, or after manufacturing the thin film transistor substrate for defining other layers in or on the thin film transistor substrate. First, a metal layer is formed on a substrate, and the metal layer is then patterned to define a gate line 11 and a gate electrode 11A connecting to the gate line 11. In one embodiment, the substrate 10 can be glass, plastic, or other common substrate material. In one embodiment, the metal layer can single-layered or multi-layered of molybdenum, aluminum, copper, titanium, or an alloy thereof. The metal layer can be formed by physical vapor deposition (PVD), sputtering, or the like. The method of patterning the metal layer can be lithography and etching processes. The lithography process may include the following steps: coating a photoresist such as spin-on, soft baking, photomask alignment, exposure, post-exposure baking, development, rinsing, drying such as hard baking, another suitable step, or a combination thereof. Moreover, the exposure in the lithography process can be replaced with another step such as maskless lithography, electron-beam writing, or ion-beam writing. After the lithography process, the etching process such as dry etching, wet etching, or a combination thereof can be performed to pattern the metal layer. The photoresist pattern can be removed by ashing, stripping, or a combination thereof after the etching process.

An insulation layer 13 and a planarization layer 15 are then sequentially formed on the gate line 11 and the gate electrode 11A. The insulation layer 13 can be organic siloxane compound or inorganic material such as silicon nitride, silicon oxide, silicon oxynitride, silicon carbide, aluminum oxide, hafnium oxide, or a multi-layered structure thereof. The insulating layer can be formed by chemical vapor deposition (CVD) such as plasma enhanced CVD (PECVD), low pressure CVD (LPCVD), sub-atmosphere CVD (SACVD), physical vapor deposition (PVD), or the like. In one embodiment, the insulation layer has a thickness of 100 Å to 5000 Å. An overly thin insulation layer can make the transistor have a high charging capability but also make the gate insulation layer have an overly high leakage current. An overly thick insulation layer can make the transistor have an overly low charging capability. In one embodiment, the planarization layer 15 can be an organic insulation material or an inorganic insulation material, which can be formed by physical deposition or chemical vapor deposition. In one embodiment, the planarization layer 15 and the insulation layer 13 are composed of different materials. In one embodiment, the planarization layer 15 has a thickness of 5000 Å to 30000 Å. An overly thin planarization layer 15 cannot efficiently reduce the capacitance between the data line and the gate line 11 due to an overly short distance between the data line and the gate line 11. An overly thick planarization layer will negatively influence the difficulty of patterning the planarization layer. It should be explained that the insulation layer 13 and the planarization layer 15 are omitted in the top view of FIG. 2A for simplification.

Figure 1B:
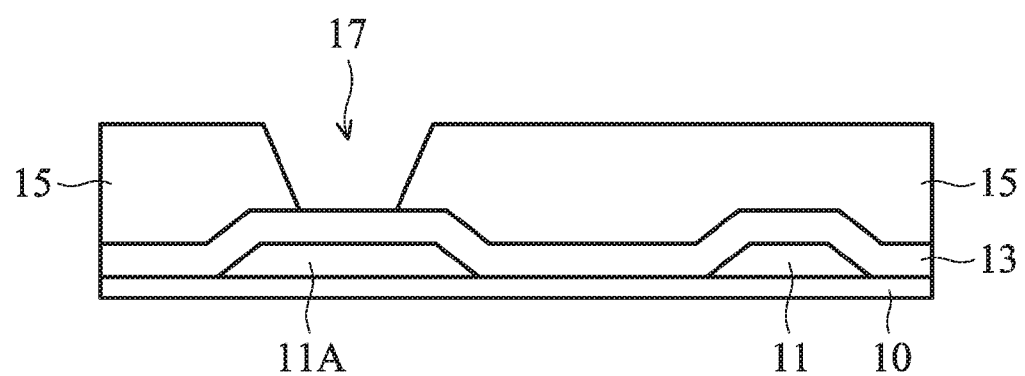
Figure 2A:
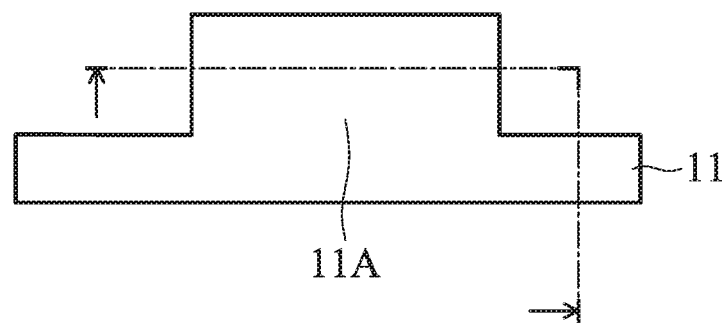
FIGS. 2A to 2D show top views corresponding to FIGS. 1A to 1D, respectively.
Figure 2B:
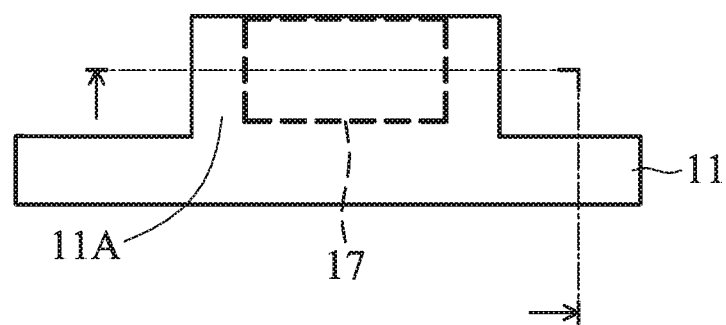

As shown in FIGS. 1B and 2B, the planarization layer 15 is then patterned to form an opening to expose a top surface of the insulation layer 13 corresponding to the gate electrode 11A. The method of forming the opening 17 can be the lithography and etching processes as described above, and the related description is omitted here.

Figure 1C:
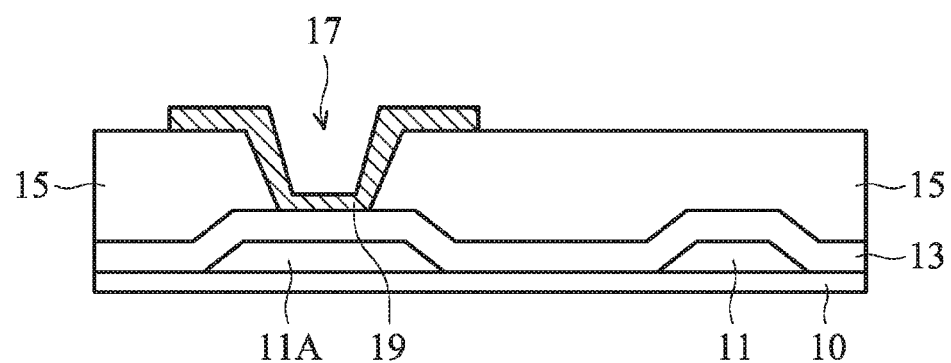
Figure 2C:
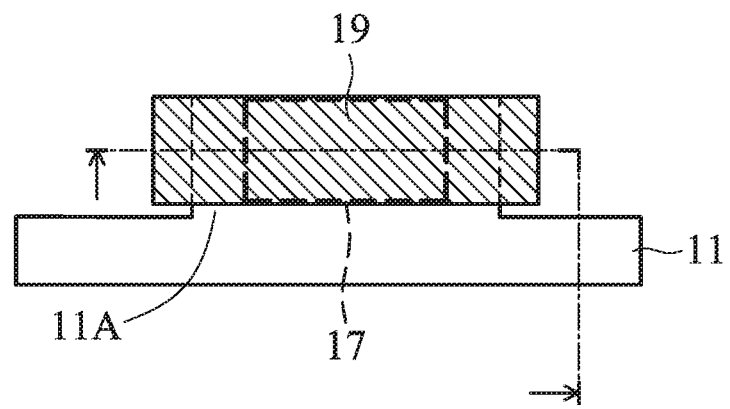

As shown in FIGS. 1C and 2C, an active layer is then formed on the above structure, and the active layer is then patterned to define an active layer 19 on sidewalls and bottom of the opening 17. As shown in FIG. 1C, the active layer 19 can be slightly greater than the opening 17, i.e. extending to a part of the surface of the planarization layer 15. In one embodiment, the active layer 19 can be polysilicon or metal oxide semiconductor such as indium gallium zinc oxide (IGZO). The active layer can be formed by CVD such as PECVD, LPCVD, or SACVD, physical vapor deposition (PVD), deposition of solution synthesis, or the like. The method of patterning the active layer 19 can be the lithography and etching processes as described above, and the related description is omitted here.

Figure 1D:
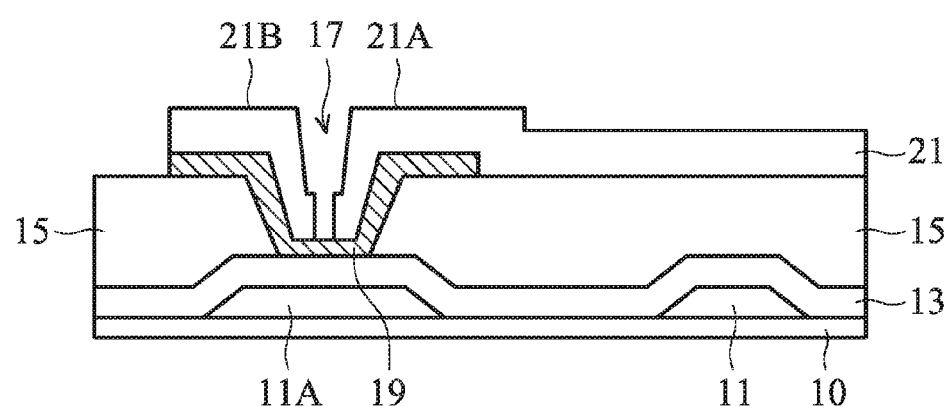
Figure 2D:
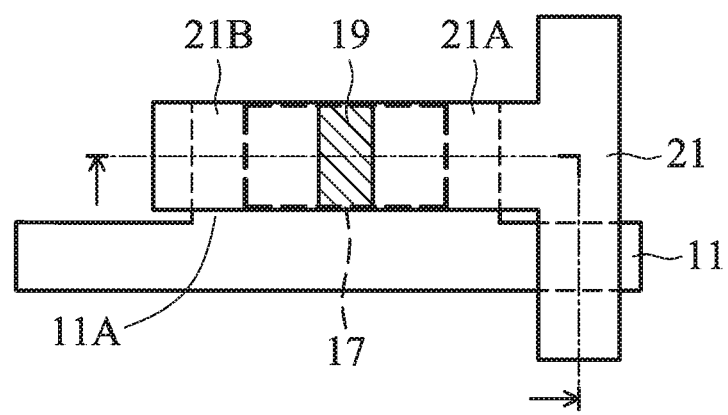

As shown in FIGS. 1D and 2D, a metal layer is then formed on the above structure, and the metal layer is then patterned to define a data line 21, a source electrode 21A, and a drain electrode 21B. In one embodiment, the metal layer can be single-layered of multi-layered of molybdenum, aluminum, copper, titanium, or an alloy thereof. The metal layer can be formed by physical vapor deposition (PVD) or sputtering. The metal layer can be patterned by the lithography and etching described above, and the related description is omitted here. The planarization layer 15 and the insulation layer 13 are disposed between the data line 21 and gate line 11 at their overlapping location. The source electrode 21A is connected to the data line 21. The source electrode 21A and the drain electrode 21B are disposed on the active layer 19 on the two opposite sidewalls of the opening 17, respectively. As such, the source electrode 21A and the drain electrode 21B are not connected to each other. Note that if the source electrode 21A and the drain electrode 21B are only disposed on parts of the active layer 19 on the planarization layer 15 without extending onto the active layer 19 on the sidewalls of the opening 17, the active layer 19 having an overly long channel length will be difficult to drive.

Figure 3A:
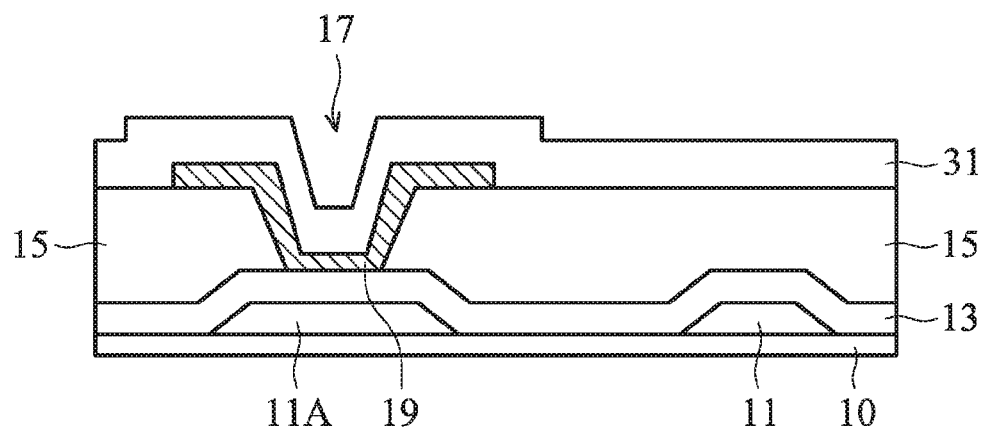
FIGS. 3A to 3C show cross sections of a thin film transistor substrate during different manufacturing stages in one embodiment of the disclosure.
Figure 3B:
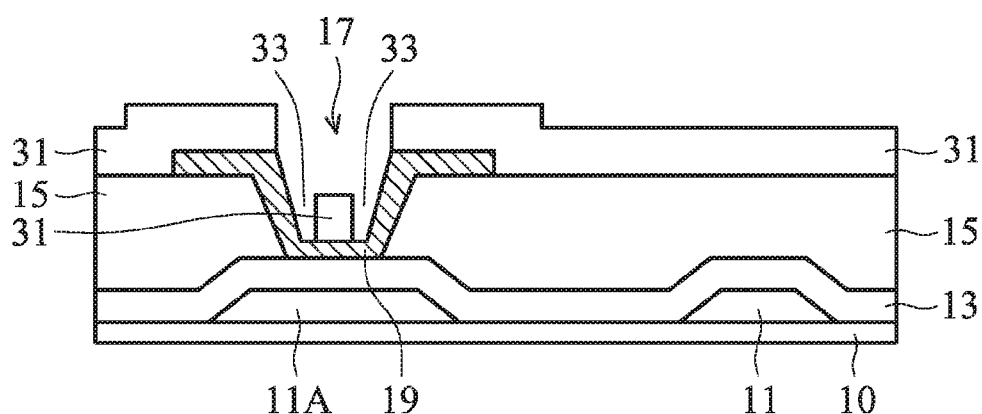
Figure 3C:
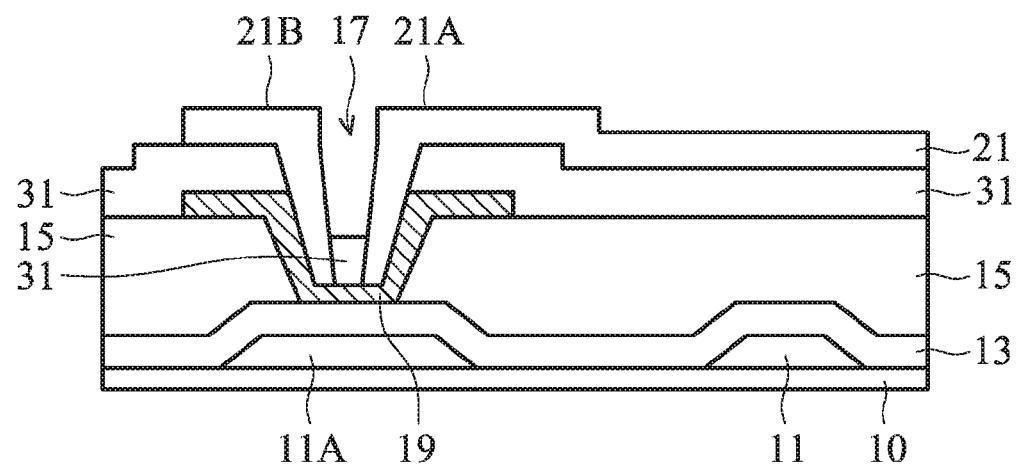
Figure 4A:
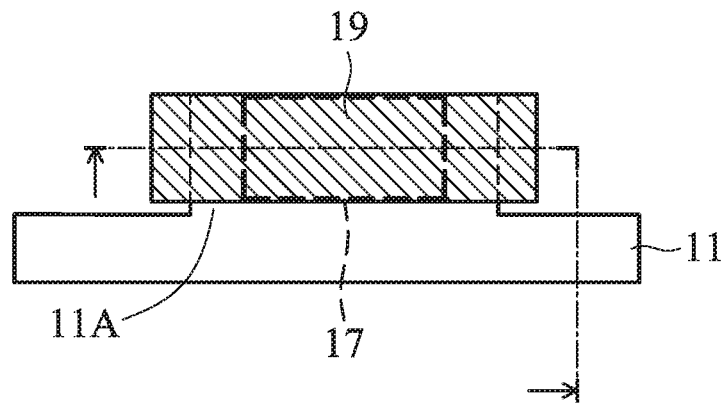
FIGS. 4A to 4C show top views corresponding to FIGS. 3A to 3C, respectively.

FIGS. 3A to 3C show cross sections of a thin film transistor substrate during different manufacturing stages in one embodiment of the disclosure. FIGS. 3A to 3C are cross sections along the dotted lines in the top views of FIGS. 4A to 4C, respectively. After the structure of FIGS. 1C and 2C is completed, an etch stop layer 31 is formed thereon as shown in FIGS. 3A and 4A. In one embodiment, the etch stop layer 31 can be inorganic insulation layer such as silicon oxide, aluminum oxide, titanium oxide, and the like. The etch stop layer 31 can be formed by chemical vapor deposition, atomic layer deposition, physical deposition, and the like. In one embodiment, the etch stop layer 31 has a thickness of 500 Å to 3000 Å. An overly thin etch stop layer cannot provide sufficient protection for the active layer. An overly thick etch stop layer may increase the process period and the difficulty of patterning the etch stop layer. It should be explained that the insulation layer 13, the planarization layer 15, and the etch stop layer 31 are omitted in the top view of FIG. 3A for simplification.

Figure 4B:
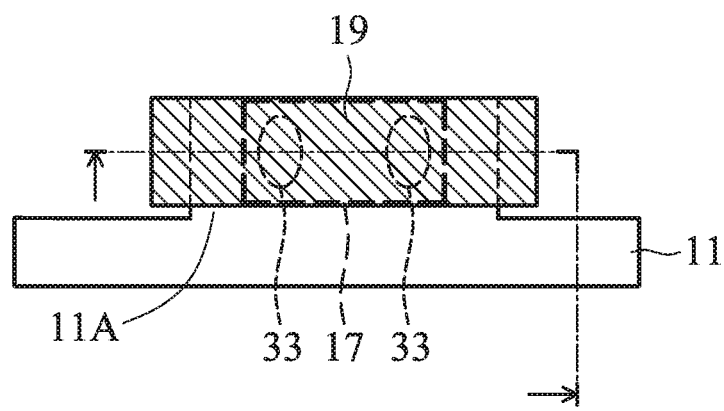

As shown in FIGS. 3B and 4B, the etch stop layer 31 is then patterned to form contact vias 33 to expose the active layer 19 on the sidewalls of the opening 17 and parts of the active layer 19 on the bottom of the opening 17. The method of forming the contact vias 33 can be the lithography and etching processes as described above, and the related description is omitted here.

Figure 4C:
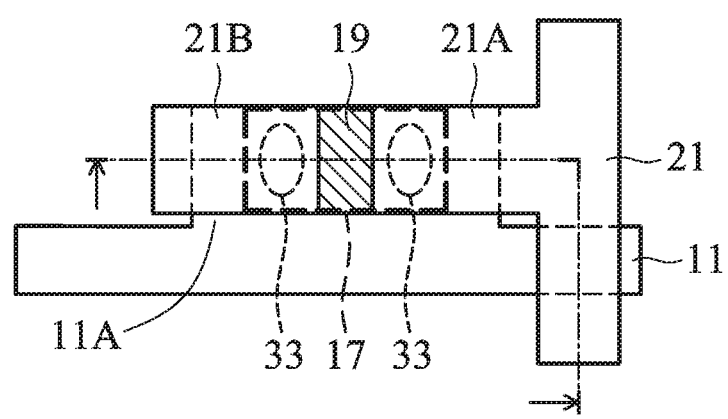

As shown in FIGS. 3C and 4C, a metal layer is formed on the described structure, and the metal layer is patterned to define a data line 21, a source electrode 21A, and a drain electrode 21B. The composition and method for manufacturing the metal layer is similar to the description above, the metal layer can be patterned by the lithography and etching described above, and the related description is omitted here. The etch stop layer 31, the planarization layer 15, and the insulation layer 13 are disposed between the data line 21 and gate line 11 at their overlapping location. The source electrode 21A is connected to the data line 21. The source electrode 21A and the drain electrode 21B contact the active layer 19 on the opposite sidewalls of the opening 17 through the contact vias 33, respectively. As such, the source electrode 21A and the drain electrode 21B are not connected to each other. There are more layers between the data line 21 and the gate line 11 in this embodiment than in the previous embodiment, thereby further reducing the capacitance between the data line 21 and the gate line 11. In addition, the etch stop layer 31 disposed between the source electrode 21A and the drain electrode 21B on the bottom of the opening 17 may further avoid the source electrode 21A electrically connecting to the drain electrode 21B, which results from a processing error.

Figure 5A:
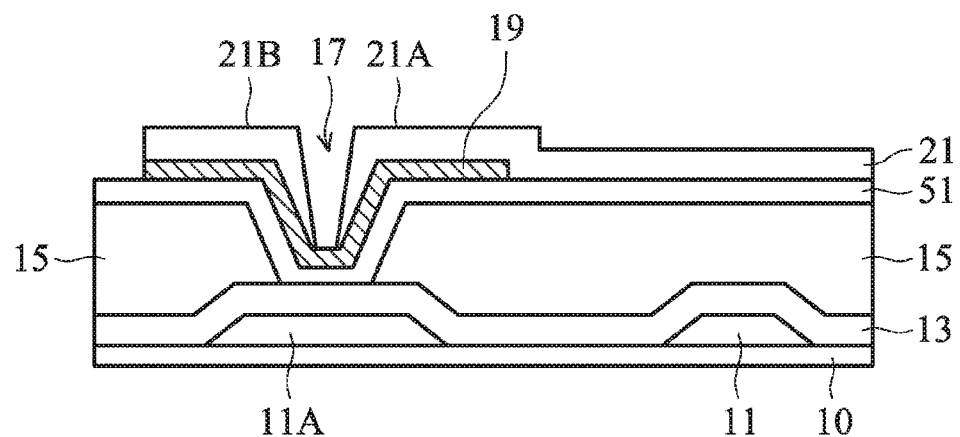
FIGS. 5A and 5B show cross sections of a thin film transistor substrate in embodiments of the disclosure.
Figure 5B:
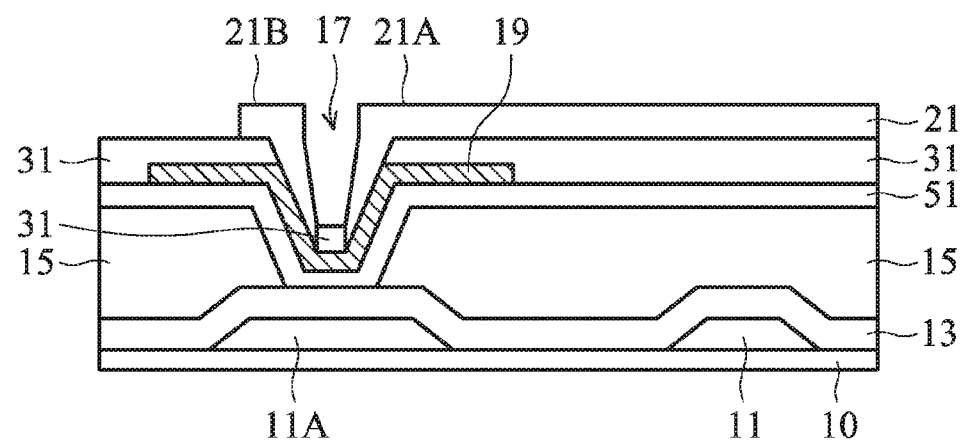

FIGS. 5A and 5B show cross sections of a thin film transistor substrate in embodiments of the disclosure. FIG. 5A and FIG. 1D have similar structures, and the difference in FIG. 5A is another insulation layer 51 being formed after forming the opening 17 and before forming the active layer 19. The insulation layer 51 and the active layer 19 in FIG. 5A have better interfacial properties. In one embodiment, the insulation layer 51 can be silicon oxide, aluminum oxide, or titanium oxide. The insulation layer 51 can be formed by chemical vapor deposition, atomic layer deposition, physical deposition, or the like. In one embodiment, the insulation layer 51 has a thickness of 100 Å to 5000 Å. An overly thin insulation layer may cause the insulation layer to have an overly high leakage current. An overly thick insulation layer may negatively influence the charging capability of the transistor.

FIG. 5B shows a cross-sectional view of a thin film transistor in one embodiment of the disclosure. FIG. 5B and FIG. 3C have similar structures, and the difference in FIG. 5B is another insulation layer 51 being formed after forming the opening 17 and before forming the active layer 19. The insulation layer 51 and the active layer 19 in FIG. 5B have better interfacial properties. The composition, the thickness, and the method for manufacturing the insulation layer 51 is similar to the description above, and the related description is omitted here.

Figure 6A:
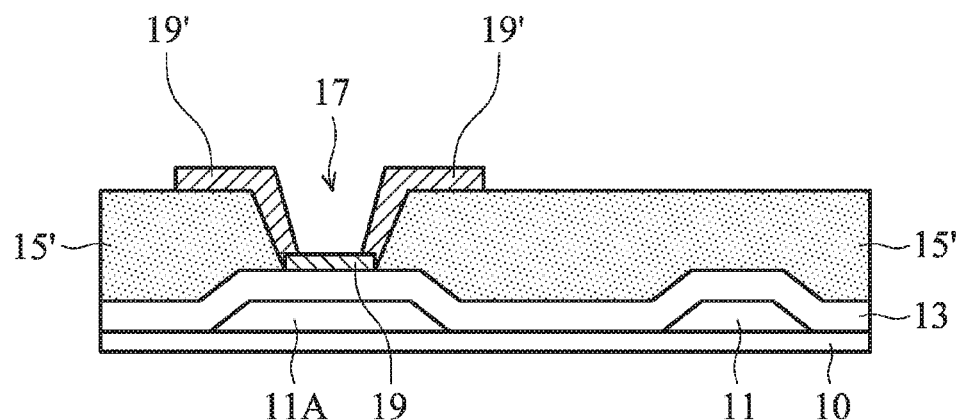
FIGS. 6A to 6B show cross sections of a thin film transistor substrate during different manufacturing stages in one embodiment of the disclosure.
Figure 6B:
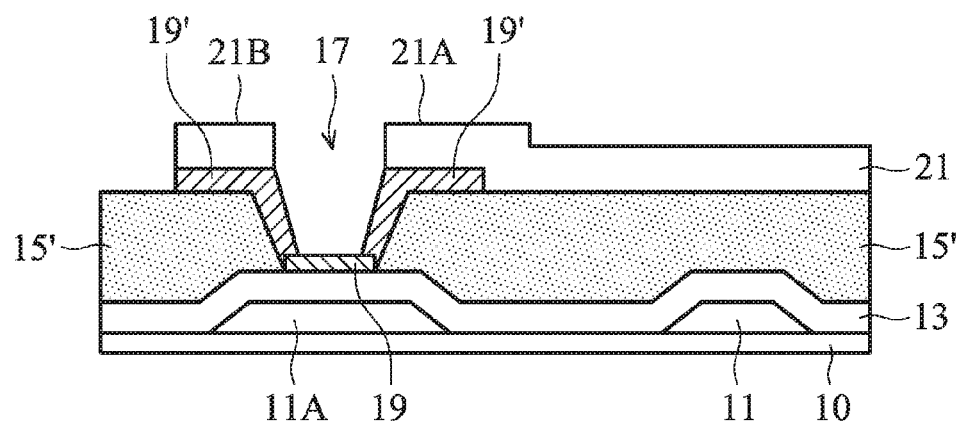

FIGS. 6A to 6B show cross sections of a thin film transistor substrate during different manufacturing stages in one embodiment of the disclosure. FIGS. 6A to 6B are cross sections along the dotted lines in the top views of FIGS. 7A to 7B, respectively. FIGS. 6A and 1C have similar structures, and the difference in FIG. 6A is the active layer 19 is the metal oxide semiconductor such as IGZO. The active layer 19 includes a first part on the bottom of the opening 17 and a second part on the planarization layer 15. In FIG. 6A, the planarization layer 15 in FIG. 1C is changed to a planarization layer 15' which may transfer the metal oxide semiconductor to a conductor. In one embodiment, the planarization layer 15' is silicon nitride or a hydrogen-rich insulation layer with a hydrogen content over 10 atomic %. As such, the second part of the active layer 19 on the planarization layer 15' will be transferred to a metal oxide conductor layer 19'. It should be explained that the insulation layer 13 and the planarization layer 15' are omitted in the top view of FIG. 7A for simplification.

Figure 7A:
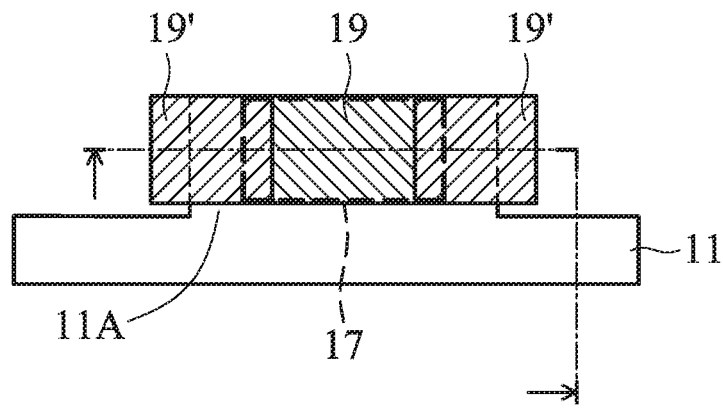
FIGS. 7A to 7B show top views corresponding to FIGS. 6A to 6B, respectively.
Figure 7B:
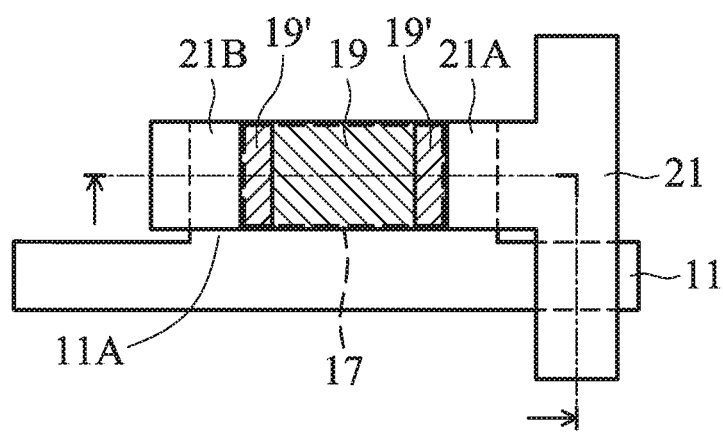

As shown in FIGS. 6B and 7B, a metal layer is formed on the described structure, and the metal layer is patterned to define a data line 21, a source electrode 21A, and a drain electrode 21B. The composition and method for manufacturing the metal layer is similar to the description above, the metal layer can be patterned by the lithography and etching described above, and the related description is omitted here. The planarization layer 15' and the insulation layer 13 are disposed between the data line 21 and gate line 11 at their overlapping location. The source electrode 21A is connected to the data line 21. The source electrode 21A and the drain electrode 21B are disposed on the metal oxide conductor layer 19' on two sides of the active layer 19, respectively. As such, the source electrode 21A and the drain electrode 21B are not connected to each other. Because the active layer 19 on the planarization layer 15' is transferred to the metal oxide conductor layer 19', the source electrode 21A and the drain electrode 21B only need to contact the metal oxide conductor layer 19' on the planarization layer 15' without extending into the opening 17. Therefore, the dimension of the opening 17 can be reduced further, and the source electrode 21A electrically connecting to the drain electrode 21B, which results from a processing error, can be avoided.

Figure 8A:
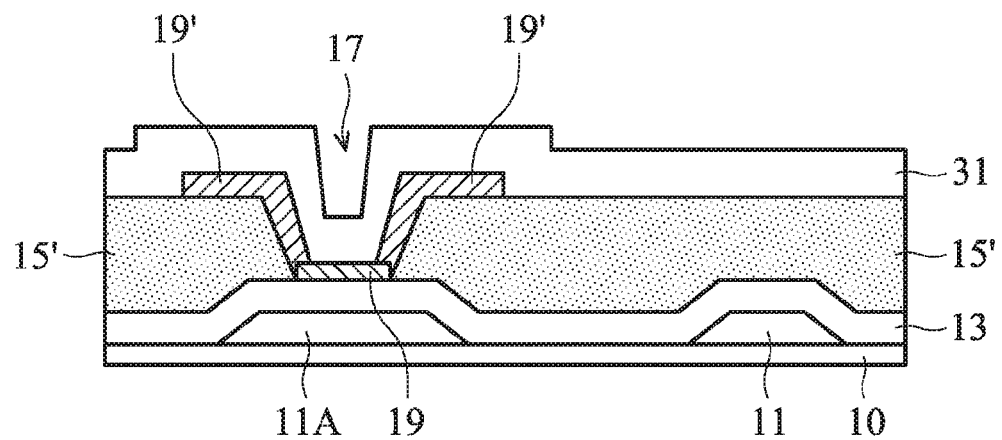
FIGS. 8A to 8C show cross sections of a thin film transistor substrate during different manufacturing stages in one embodiment of the disclosure.
Figure 8B:
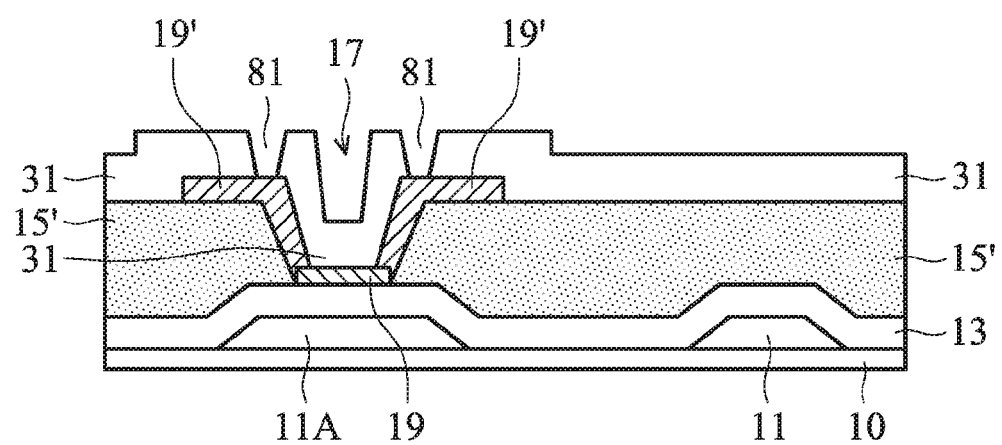
Figure 8C:
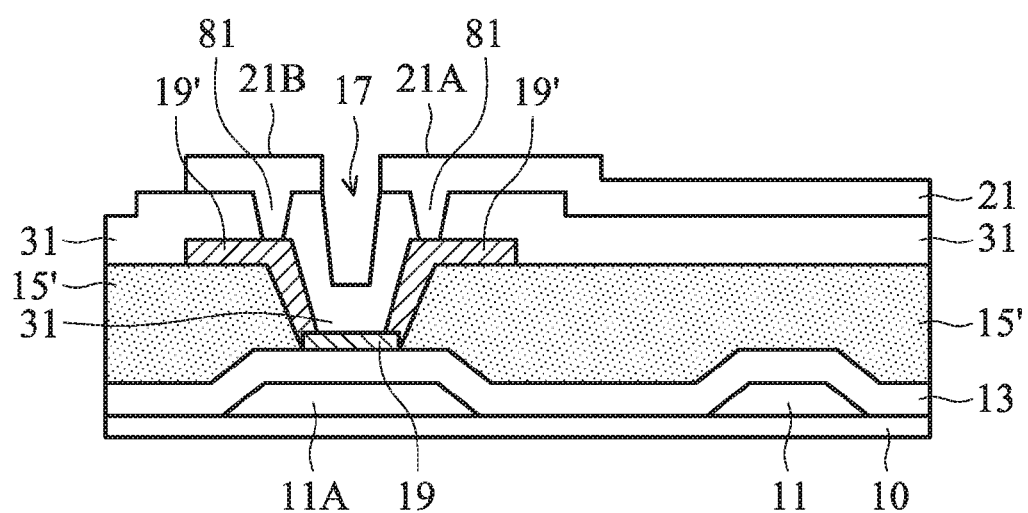
Figure 9A:
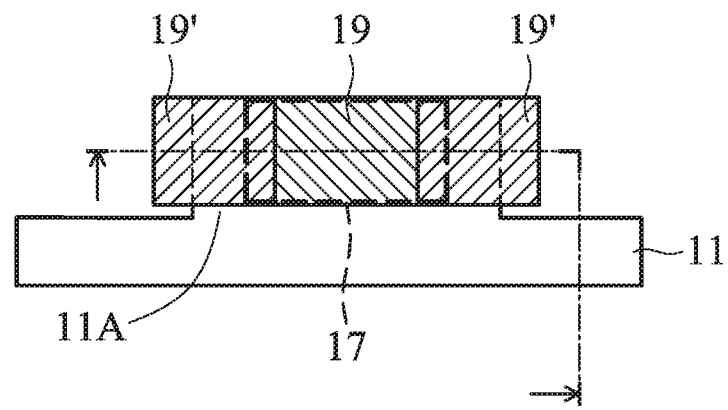
FIGS. 9A to 9C show top views corresponding to FIGS. 8A to 8C, respectively.

FIGS. 8A to 8C show cross sections of a thin film transistor substrate during different manufacturing stages in one embodiment of the disclosure. FIGS. 8A to 8C are cross sections along the dotted lines in the top views of FIGS. 9A to 9C, respectively. After the structure of FIGS. 6A and 7A is completed, an etch stop layer 31 is formed thereon as shown in FIGS. 8A and 9A. The composition, the thickness, and the method for manufacturing the etch stop layer 31 are similar to the description above, and the related description is omitted here. It should be explained that the insulation layer 13, the planarization layer 15', and the etch stop layer 31 are omitted in the top view of FIG. 9A for simplification.

Figure 9B:
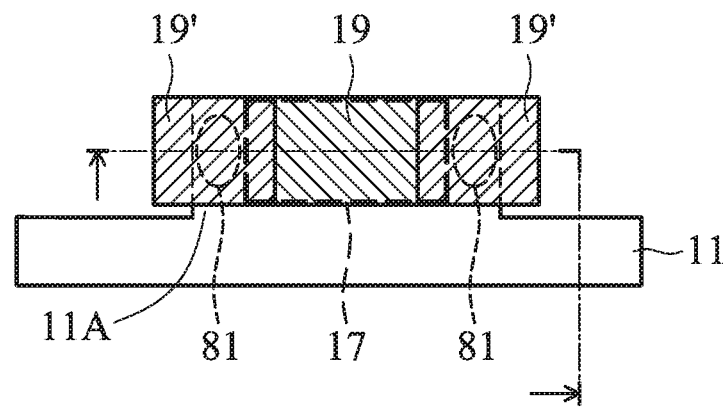

As shown in FIGS. 8B and 9B, the etch stop layer 31 is then patterned to form contact vias 81 to expose the metal oxide conductor layer 19' on the planarization layer 15'. The contact vias 81 can be formed by the lithography and etching processes as described above, and the related description is omitted here.

Figure 9C:
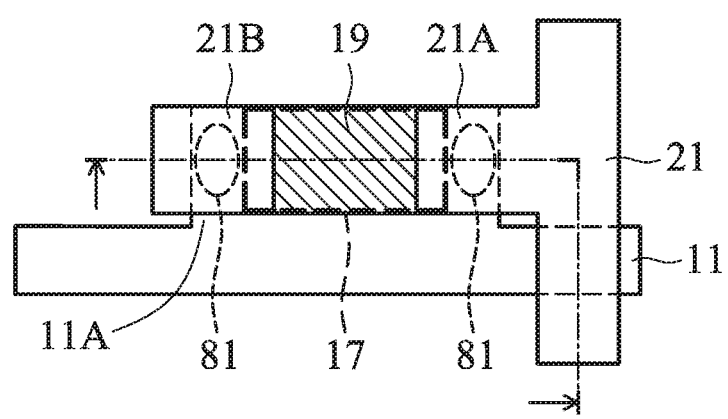

As shown in FIGS. 8C and 9C, a metal layer is then formed on the described structure, and the metal layer is patterned to define a data line 21, a source electrode 21A, and a drain electrode 21B. The composition and method for manufacturing the metal layer is similar to the description above, the metal layer can be patterned by the lithography and etching described above, and the related description is omitted here. The etch stop layer 31, the planarization layer 15', and the insulation layer 13 are disposed between the data line 21 and gate line 11 at their overlapping location. The source electrode 21A is connected to the data line 21. The source electrode 21A and the drain electrode 21B contact the metal oxide conductor layer 19' on the planarization layer 15' on the opposite sides of the opening 17 through the contact vias 81, respectively. As such, the source electrode 21A and the drain electrode 21B are not connected to each other. There are more layers between the data line 21 and the gate line 11 in this embodiment than in the previous embodiment, thereby further reducing the capacitance between the data line 21 and the gate line 11. In addition, the source electrode 21A and the drain electrode 21B should not need to extend into the opening 17. Therefore, the dimension of the opening 17 can be reduced further, and the source electrode 21A electrically connecting to the drain electrode 21B, which results from a processing error, can be avoided.

Figure 10A:
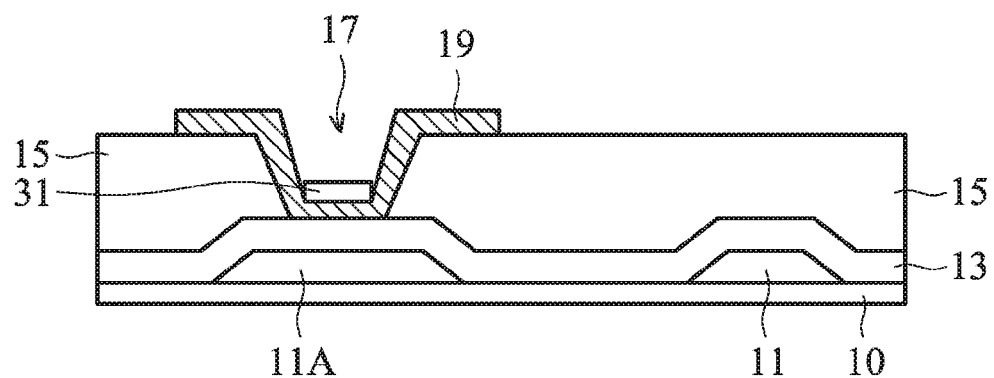
FIGS. 10A to 10D show cross sections of a thin film transistor substrate during different manufacturing stages in one embodiment of the disclosure.

FIGS. 10A to 10D show cross sections of a thin film transistor substrate during different manufacturing stages in one embodiment of the disclosure. FIGS. 10A to 10D are cross sections along the dotted lines in the top views of FIGS. 11A to 11D, respectively. After the structure of FIG. 3A is completed, the etch stop layer 31 is patterned to be at least kept on the active layer 19 on the bottom of the opening 17, as shown in FIG. 10A. It should be explained that the insulation layer 13 and the planarization layer 15 are omitted in the top view of FIG. 11A for simplification.

Figure 10B:
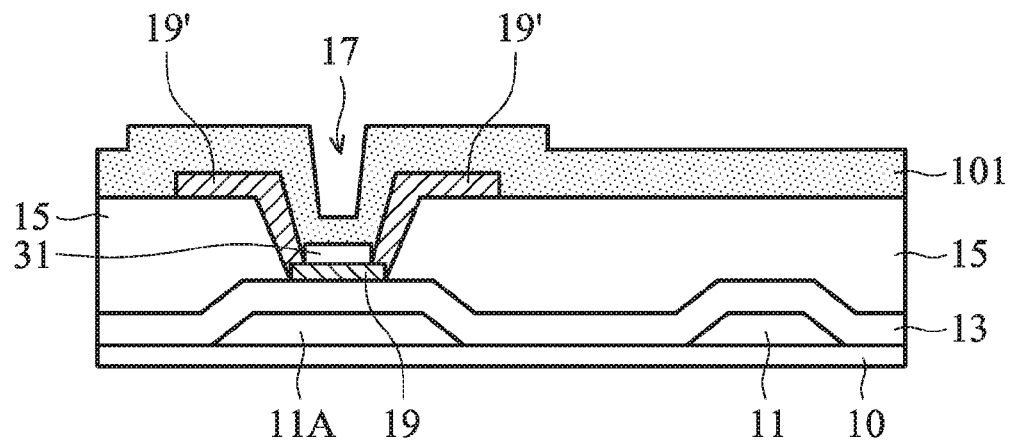
Figure 11A:
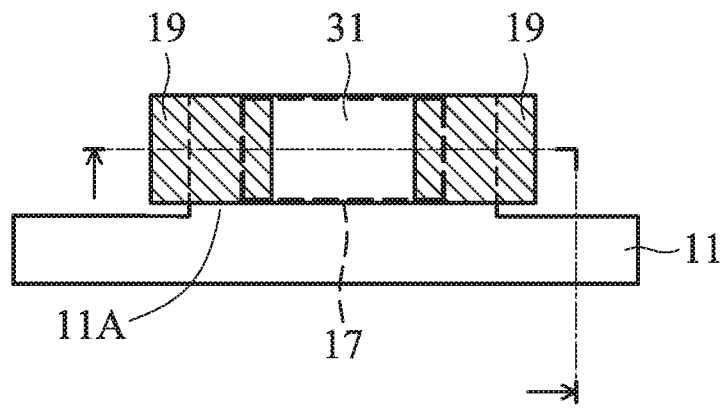
FIGS. 11A to 11D show top views corresponding to FIGS. 10A to 10D, respectively.
Figure 11B:
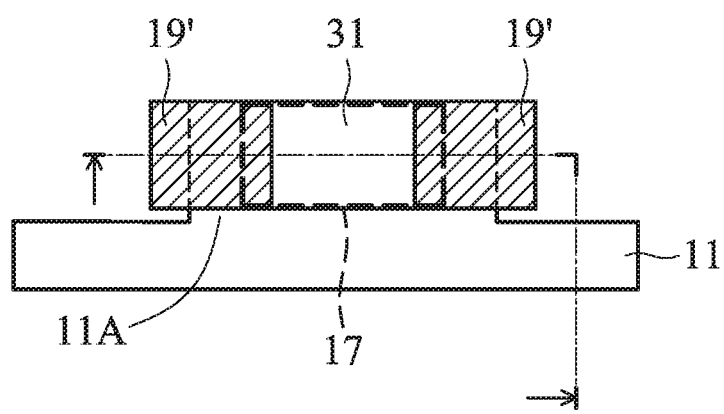

As shown in FIG. 10B, a protection layer 101 is then formed on the above structure. In this embodiment, the active layer 19 is metal oxide semiconductor. The protection layer 101 is silicon nitride or hydrogen-rich insulation layer.

The protection layer 101 can be formed by chemical vapor deposition, physical deposition, or the like. Parts of the active layer 19 other than the part on the bottom of the opening 17 can be transferred to a metal oxide conductor layer 19' by the protection layer 101.

Figure 10C:
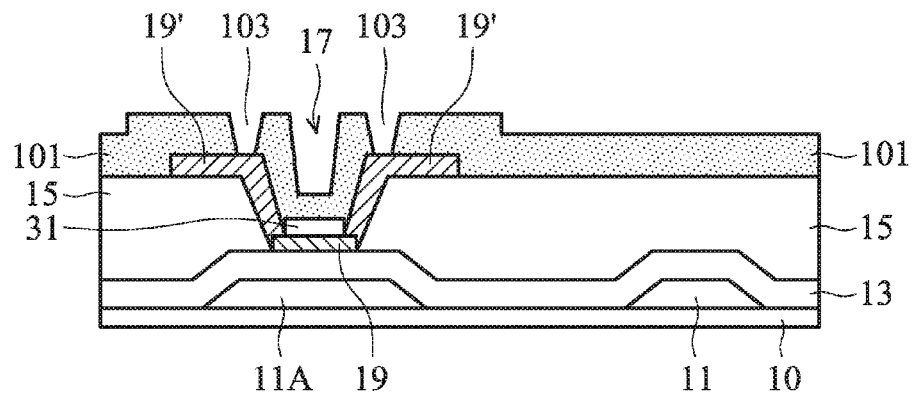
Figure 11C:
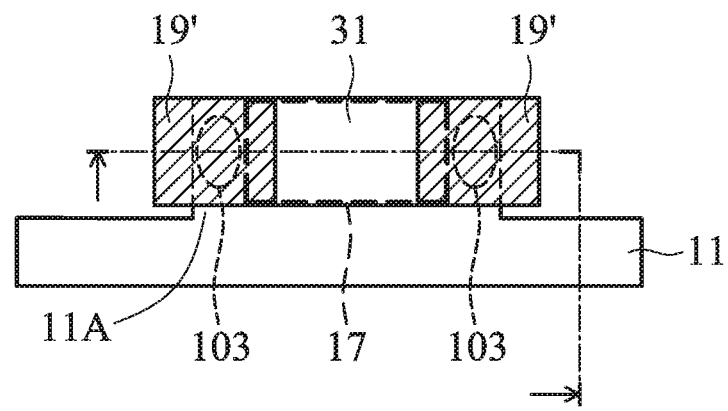

As shown in FIGS. 10C and 11C, contact vias 103 are formed to penetrate through the protection layer 101, thereby exposing the metal oxide conductor layer 19' on the planarization layer 15. The contact vias 103 can be formed by the lithography and etching processes as described above, and the related description is omitted here.

Figure 10D:
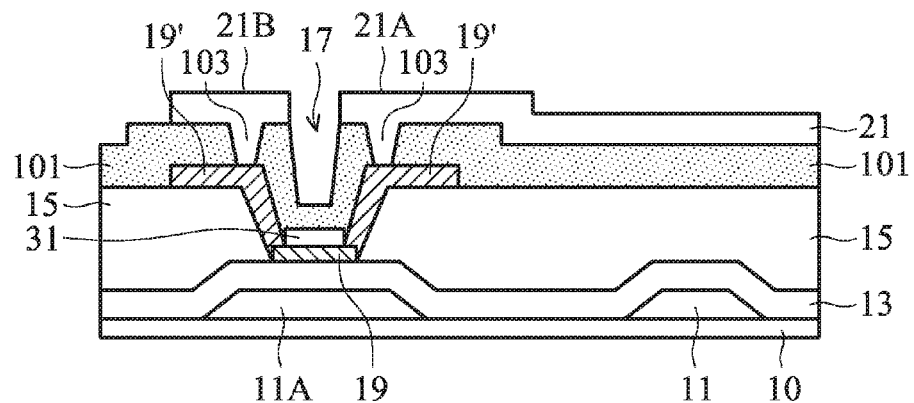
Figure 11D:
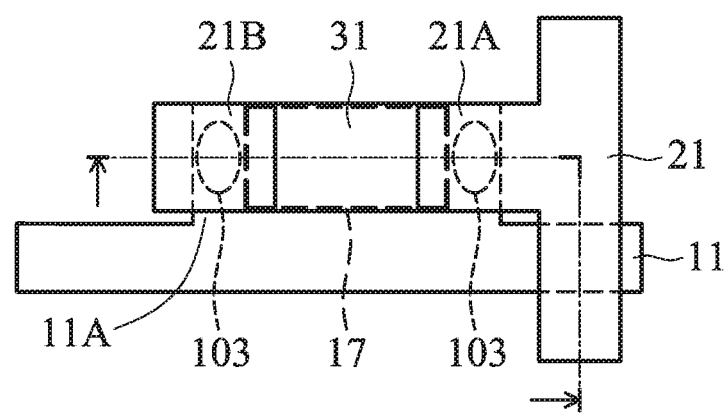

As shown in FIGS. 10D and 11D, a metal layer is then formed on the described structure, and the metal layer is patterned to define a data line 21, a source electrode 21A, and a drain electrode 21B. The composition and method for manufacturing the metal layer is similar to the description above, the metal layer can be patterned by the lithography and etching described above, and the related description is omitted here. The protection layer 101, the planarization layer 15, and the insulation layer 13 are disposed between the data line 21 and gate line 11 at their overlapping location. The source electrode 21A is connected to the data line 21. The source electrode 21A and the drain electrode 21B contact two sides of the metal oxide conductor layer 19' through the contact vias 103, respectively. As such, the source electrode 21A and the drain electrode 21B are not connected to each other. Because the etch stop layer 31 is disposed between the protection layer 101 and the bottom of the opening 17, it may avoid transferring the active layer 19 on the bottom of the opening 17 to a conductor.

Figure 12A:
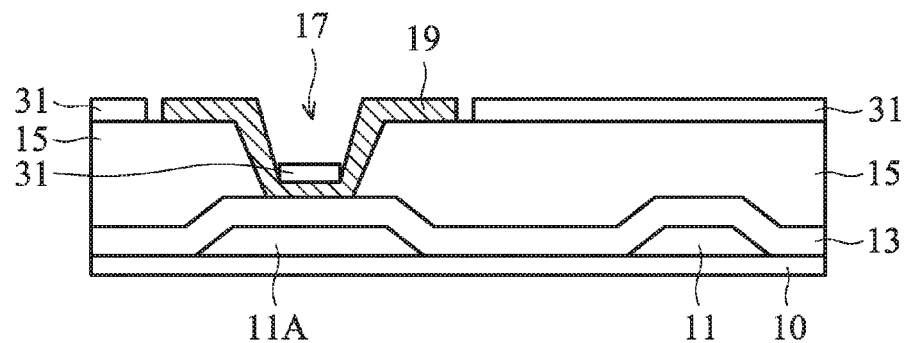
FIGS. 12A to 12D show cross sections of a thin film transistor substrate during different manufacturing stages in one embodiment of the disclosure.

FIGS. 12A to 12D show cross sections of a thin film transistor substrate during different manufacturing stages in one embodiment of the disclosure. FIGS. 12A to 12D are cross sections along the dotted lines in the top views of FIGS. 13A to 13D, respectively. After the structure of FIG. 3A is completed, the etch stop layer 31 is patterned to be at least kept on the active layer 19 on the bottom of the opening 17 and kept on the regions other than the active layer 19, as shown in FIGS. 12A and 13A. It should be explained that the insulation layer 13 and the planarization layer 15 are omitted in the top view of FIG. 13A for simplification.

Figure 12B:
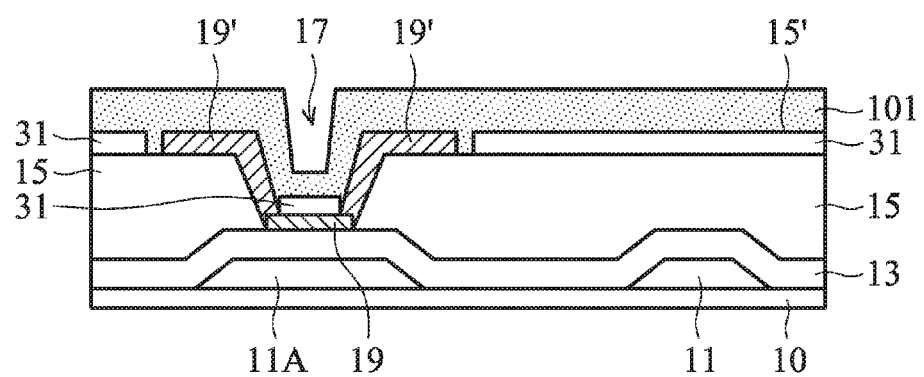
Figure 13A:
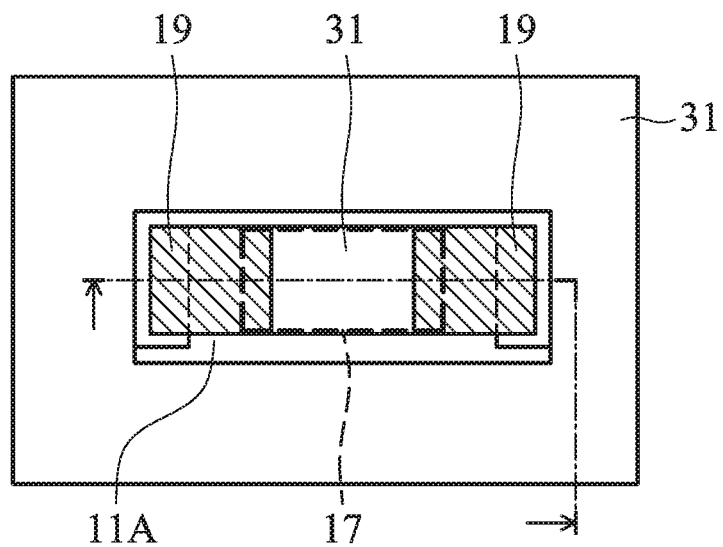
FIGS. 13A to 13D show top views corresponding to FIGS. 12A to 12D, respectively.
Figure 13B:
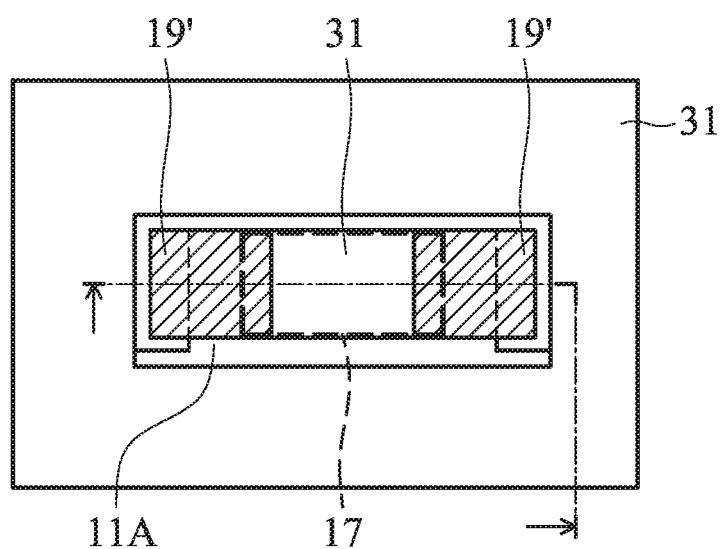

As shown in FIG. 12B, a protection layer 101 is then formed on the above structure. In this embodiment, the active layer 19 is metal oxide semiconductor. The protection layer 101 is silicon nitride or hydrogen-rich insulation layer. The protection layer 101 can be formed by chemical vapor deposition, physical deposition, or the like. Parts of the active layer 19 other than the part on the bottom of the opening 17 can be transferred to a metal oxide conductor layer 19' by the protection layer 101.

Figure 12C:
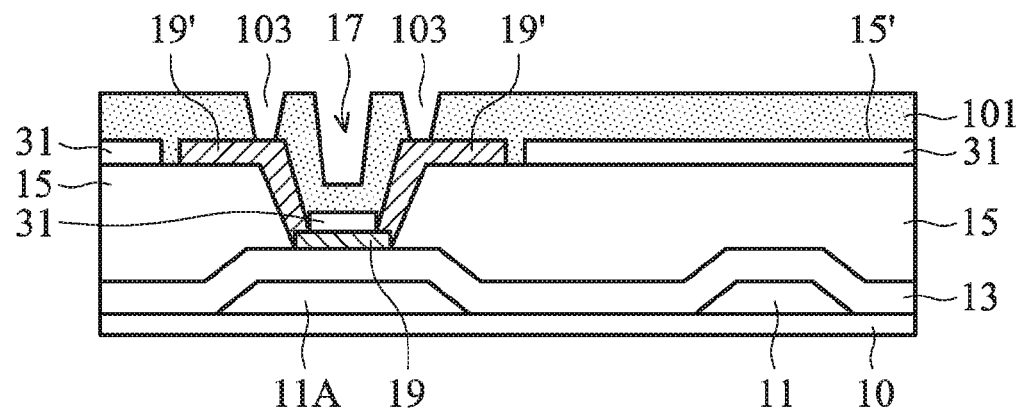
Figure 13C:
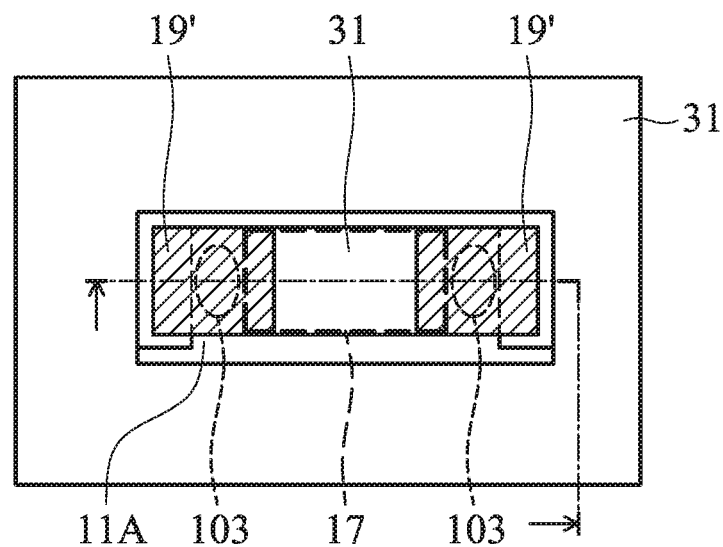

As shown in FIGS. 12C and 13C, the protection layer 101 is patterned to form contact vias 103 to expose the metal oxide conductor layer 19' on the planarization layer 15. The contact vias 103 can be formed by the lithography and etching processes as described above, and the related description is omitted here.

Figure 12D:
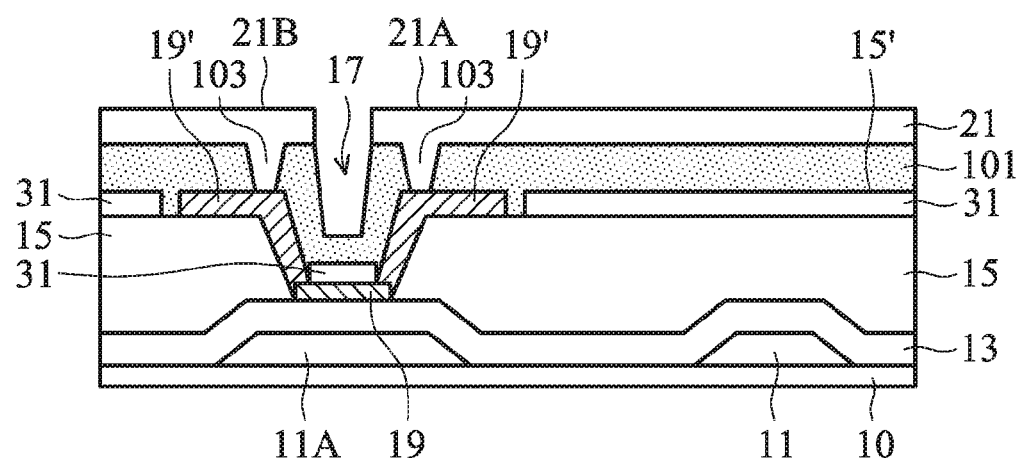
Figure 13D:
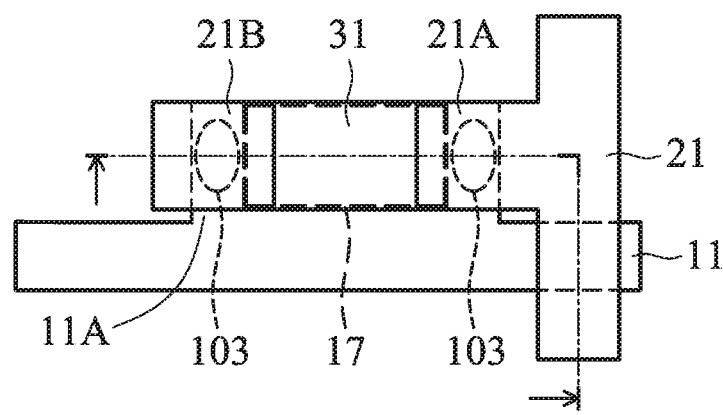

As shown in FIGS. 12D and 13D, a metal layer is then formed on the described structure, and the metal layer is patterned to define a data line 21, a source electrode 21A, and a drain electrode 21B. The composition and method for manufacturing the metal layer is similar to the description above, the metal layer can be patterned by the lithography and etching described above, and the related description is omitted here. The protection layer 101, the etch stop layer 31, the planarization layer 15, and the insulation layer 13 are disposed between the data line 21 and gate line 11 at their overlapping location. The source electrode 21A is connected to the data line 21. The source electrode 21A and the drain electrode 21B contact two sides of the metal oxide conductor layer 19' through the contact vias 103, respectively. As such, the source electrode 21A and the drain electrode 21B are not connected to each other. There are more layers between the data line 21 and the gate line 11 in this embodiment than in the previous embodiment, thereby further reducing the capacitance between the data line 21 and the gate line 11.

The drain electrodes 21B of the thin film transistor substrates in FIGS. 1D, 3C, 5A, 5B, 6B, 8C, 10D, and 12D can be further connected to a pixel electrode to control the brightness/darkness of the pixel region. The pixel region may further include a common electrode. The pixel electrode and the common electrode are usually designed in a thin film transistor and the related description is omitted here.

Figure 14:
FIG. 14 shows a display panel in one embodiment of the disclosure.

FIG. 14 shows a cross section of a display panel in one embodiment of the disclosure. In FIG. 14, the display panel includes a thin film transistor substrate 1401, an opposite substrate 1405, and a display medium 1403 disposed between the thin film transistor substrate 1401 and the opposite substrate 1405. The thin film transistor substrate 1401 can be the thin film transistor substrate as shown in FIG. 1D, 3C, 5A, 5B, 6B, 8C, 10D, or 12D. The display medium 1030 can be a liquid-crystal layer, an organic light-emitting layer, or an inorganic light-emitting layer. The opposite substrate 1020 can be a color filter substrate or a transparent substrate.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display panel, comprising:
   a substrate;
   a first metal layer on the substrate, wherein the first metal layer includes a gate electrode and a gate line connecting to the gate electrode;
   a first insulation layer on the first metal layer;
   a planarization layer on the first insulation layer;
   an opening defined by sidewalls of the planarization layer and a surface of the first insulation layer, wherein the opening overlaps the gate electrode;
   an active layer on the planarization layer and covering the opening; and
   a second metal layer on the active layer, wherein the second metal layer includes a source electrode contacting the active layer and a data line connecting to the source electrode,
   wherein the planarization layer and the first insulation layer are disposed between the data line and the gate line,
   an etch stop layer on the active layer and the planarization layer, wherein the etch stop layer includes a plurality of contact vias to expose parts of the active layer on the opening, the source electrode contacts the active layer through one of the contact vias, and the etch stop layer, the planarization layer, and the first insulation layer are disposed between the data line and the gate line;
   a second insulation layer on the planarization layer, wherein the active layer is disposed on the second insulation layer, and the etch stop layer, the second insulation layer, the planarization layer, and the first insulation layer are disposed between the data line and the gate line.

2. The display panel as claimed in claim 1, wherein the second metal layer contacts the active layer on the opening.

3. The display panel as claimed in claim 2, further comprising a second insulation layer on the planarization layer, wherein the active layer is disposed on the second insulation layer, and the second insulation layer, the planarization layer, and the first insulation layer are disposed between the data line and the gate line.

4. The display panel as claimed in claim 1, wherein the active layer comprises a first part on a surface of the first insulation layer and a second part on the planarization layer, wherein the second metal layer contacts the second part of the active layer.

5. The display panel as claimed in claim 4, wherein the planarization layer is composed of silicon nitride or hydrogen-rich insulation material.

6. The display panel as claimed in claim 4, further comprising an etch stop layer on the active layer and the planarization layer, wherein the etch stop layer includes a plurality of contact vias to expose the second part of the active layer, the source electrode contacts the second part of the active layer through one of the contact vias, and the etch stop layer, the planarization layer, and the first insulation layer are disposed between the data line and the gate line.

7. The display panel as claimed in claim 4, further comprising:
an etch stop layer on the first part of the active layer; and
a protection layer on the etch stop layer, the second part of the active layer, and the planarization layer,
wherein the protection layer includes a plurality of contact vias to expose the second part of the active layer, the source electrode contacts the second part of the active layer through one of the contact vias, and the protection layer, the planarization layer, and the first insulation layer are disposed between the data line and the gate line.

8. The display panel as claimed in claim 7, wherein the protection layer is composed of silicon nitride or hydrogen-rich insulation material.

9. The display panel as claimed in claim 7, wherein the etch stop layer is also disposed on the planarization layer, and the protection layer, the etch stop layer, the planarization layer, and the first insulation layer are disposed between the data line and the gate line.

10. The display panel as claimed in claim 1, further comprising:
an opposite substrate; and
a display medium disposed between the substrate and the opposite substrate.

11. A display panel, comprising:
a substrate;
a first metal layer on the substrate, wherein the first metal layer includes a gate electrode and a gate line connecting to the gate electrode;
a first insulation layer on the first metal layer;
a planarization layer on the first insulation layer;
an opening defined by sidewalls of the planarization layer and a surface of the first insulation layer, wherein the opening overlaps the gate electrode;
an active layer on the planarization layer and covering the opening; and
a second metal layer on the active layer, wherein the second metal layer includes a source electrode contacting the active layer and a data line connecting to the source electrode,
wherein the planarization layer and the first insulation layer are disposed between the data line and the gate line,
wherein the active layer comprises a first part on a surface of the first insulation layer and a second part on the planarization layer, wherein the second metal layer contacts the second part of the active layer,
an etch stop layer on the first part of the active layer; and
a protection layer on the etch stop layer, the second part of the active layer, and the planarization layer,
wherein the protection layer includes a plurality of contact vias to expose the second part of the active layer, the source electrode contacts the second part of the active layer through one of the contact vias, and the protection layer, the planarization layer, and the first insulation layer are disposed between the data line and the gate line.

12. The display panel as claimed in claim 11, wherein the protection layer is composed of silicon nitride or hydrogen-rich insulation material.

13. The display panel as claimed in claim 11, wherein the etch stop layer is also disposed on the planarization layer, and the protection layer, the etch stop layer, the planarization layer, and the first insulation layer are disposed between the data line and the gate line.

14. The display panel as claimed in claim 11, further comprising:
an opposite substrate; and
a display medium disposed between the substrate and the opposite substrate.

* * * * *